(12) United States Patent
Jiang et al.

(10) Patent No.: US 11,421,827 B2
(45) Date of Patent: Aug. 23, 2022

(54) LED FILAMENT AND LED LIGHT BULB

(71) Applicant: ZHEJIANG SUPER LIGHTING ELECTRIC APPLIANCE CO., LTD, Jinyun (CN)

(72) Inventors: Tao Jiang, Jiaxing (CN); Zhichao Zhang, Jiaxing (CN); Yukihiro Saito, Kawasaki (JP); Hayato Unagiike, Kai (JP)

(73) Assignee: ZHEJIANG SUPER LIGHTING ELECTRIC APPLIANCE CO., LTD, Jiaxing (CN)

( * ) Notice: Subject to any disclaimer, the term of this patent is extended or adjusted under 35 U.S.C. 154(b) by 0 days.

(21) Appl. No.: 16/894,913

(22) Filed: Jun. 8, 2020

(65) Prior Publication Data

US 2020/0300417 A1    Sep. 24, 2020

Related U.S. Application Data

(63) Continuation-in-part of application No. 16/748,070, filed on Jan. 21, 2020, now Pat. No. 10,784,428,
(Continued)

(30) Foreign Application Priority Data

Jun. 19, 2015  (CN) .......................... 201510347410.8
Aug. 7, 2015   (CN) .......................... 201510489363.0
(Continued)

(51) Int. Cl.
*F21K 9/232*       (2016.01)
*H01L 25/075*      (2006.01)
(Continued)

(52) U.S. Cl.
CPC ............ *F21K 9/232* (2016.08); *C08G 73/106* (2013.01); *C08G 73/1071* (2013.01);
(Continued)

(58) Field of Classification Search
CPC ....... F21K 9/232; F21K 9/238; H01L 33/504; H01L 33/507; H01L 33/50
See application file for complete search history.

(56) References Cited

U.S. PATENT DOCUMENTS 3,437,636 A    4/1969  Angelo
5,262,505 A   11/1993  Nakashima et al.
(Continued)

FOREIGN PATENT DOCUMENTS

CN    1901206 A    1/2007
CN   201163628 Y   12/2008
(Continued)

*Primary Examiner* — William N Harris
(74) *Attorney, Agent, or Firm* — Simon Kuang Lu

(57) ABSTRACT

An LED filament and an LED light bulb applying the same are provided. The LED filament includes a conductive section including a conductor; two or more LED sections connected to each other by the conductive section, and each of the LED sections includes two or more LED chips electrically connected to each other through a wire; two electrodes, electrically connected to the LED section; and a light conversion layer with a top layer and a base layer, covering the LED sections, the conductive section and the two electrodes, and a part of each of the two electrodes is exposed respectively. The LED filament is supplied with electric power no more than 8 W, when the LED filament is lit, at least 4 lm of white light is emitted per millimeter of filament length.

11 Claims, 5 Drawing Sheets

Related U.S. Application Data which is a continuation-in-part of application No. 16/234,124, filed on Dec. 27, 2018, now Pat. No. 10,845,008, which is a continuation-in-part of application No. 15/858,036, filed on Dec. 29, 2017, now Pat. No. 10,544,905, which is a continuation-in-part of application No. 15/723,297, filed on Oct. 3, 2017, now Pat. No. 10,655,792, and a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740, said application No. 15/723,297 is a continuation-in-part of application No. 15/308,995, filed as application No. PCT/CN2015/090815 on Sep. 25, 2015, now Pat. No. 10,781,979, said application No. 15/723,297 is a continuation-in-part of application No. 15/168,541, filed on May 31, 2016, now Pat. No. 9,995,474, and a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093.

(30) Foreign Application Priority Data

| Date | | Number |
|---|---|---|
| Aug. 17, 2015 | (CN) | 201510502630.3 |
| Sep. 2, 2015 | (CN) | 201510555889.4 |
| Dec. 19, 2015 | (CN) | 201510966906.3 |
| Jan. 22, 2016 | (CN) | 201610041667.5 |
| Apr. 27, 2016 | (CN) | 201610272153.0 |
| Apr. 29, 2016 | (CN) | 201610281600.9 |
| Jun. 3, 2016 | (CN) | 201610394610.3 |
| Jul. 7, 2016 | (CN) | 201610544049.2 |
| Jul. 22, 2016 | (CN) | 201610586388.7 |
| Nov. 1, 2016 | (CN) | 201610936171.4 |
| Dec. 6, 2016 | (CN) | 201611108722.4 |
| Jan. 13, 2017 | (CN) | 201710024877.8 |
| Feb. 14, 2017 | (CN) | 201710079423.0 |
| Mar. 9, 2017 | (CN) | 201710138009.2 |
| Mar. 23, 2017 | (CN) | 201710180574.5 |
| Apr. 11, 2017 | (CN) | 201710234618.8 |
| May 8, 2017 | (CN) | 201710316641.1 |
| Sep. 18, 2017 | (CN) | 201710839083.7 |
| Sep. 21, 2017 | (CN) | 201730450712.8 |
| Sep. 22, 2017 | (CN) | 201730453237.X |
| Sep. 26, 2017 | (CN) | 201710883625.0 |
| Oct. 16, 2017 | (CN) | 201730489929.X |
| Oct. 27, 2017 | (CN) | 201730517887.6 |
| Oct. 27, 2017 | (CN) | 201730518659.0 |
| Oct. 30, 2017 | (CN) | 201730520672.X |
| Dec. 26, 2017 | (CN) | 201711434993.3 |
| Dec. 29, 2017 | (CN) | 201711477767.3 |
| Jan. 12, 2018 | (CN) | 201810031786.1 |
| Jan. 23, 2018 | (CN) | 201810065369.9 |
| Apr. 17, 2018 | (CN) | 201810343825.1 |
| Apr. 17, 2018 | (CN) | 201810344630.9 |
| May 23, 2018 | (CN) | 201810498980.0 |
| May 23, 2018 | (CN) | 201810501350.4 |
| Jun. 6, 2018 | (CN) | 201810573314.9 |
| Jul. 26, 2018 | (CN) | 201810836433.9 |
| Aug. 17, 2018 | (CN) | 201810943054.X |
| Aug. 30, 2018 | (CN) | 201811005145.5 |
| Nov. 19, 2018 | (CN) | 201811378173.1 |
| Nov. 19, 2018 | (CN) | 201811378189.2 |
| Dec. 18, 2018 | (CN) | 201811549205.X |
| Jan. 22, 2019 | (CN) | 201910060475.2 |
| Nov. 1, 2019 | (CN) | 201911057715.X |
| Dec. 5, 2019 | (CN) | 201911234236.0 |

(51) Int. Cl.

| | |
|---|---|
| H01L 33/50 | (2010.01) |
| H01L 33/56 | (2010.01) |
| H01L 33/62 | (2010.01) |
| F21K 9/238 | (2016.01) |
| F21Y 115/10 | (2016.01) |
| F21Y 103/30 | (2016.01) |
| C08G 73/10 | (2006.01) |
| C08J 5/18 | (2006.01) |

(52) U.S. Cl.

CPC ............ *C08G 73/1078* (2013.01); *C08J 5/18* (2013.01); *F21K 9/238* (2016.08); *H01L 25/0753* (2013.01); *H01L 33/504* (2013.01); *H01L 33/507* (2013.01); *H01L 33/56* (2013.01); *H01L 33/62* (2013.01); *C08J 2379/08* (2013.01); *F21Y 2103/30* (2016.08); *F21Y 2115/10* (2016.08)

(56) References Cited

U.S. PATENT DOCUMENTS

| | | | |
|---|---|---|---|
| 5,859,181 | A | 1/1999 | Zhao et al. |
| D422,099 | S | 3/2000 | Kracke |
| 6,337,493 | B1 | 1/2002 | Tanizawa et al. |
| 6,346,771 | B1 | 2/2002 | Salam |
| 6,586,882 | B1 | 7/2003 | Harbers |
| 7,041,766 | B2 | 5/2006 | Yoneda et al. |
| D548,369 | S | 8/2007 | Bembridge |
| D549,360 | S | 8/2007 | An |
| D550,864 | S | 9/2007 | Hernandez, Jr. et al. |
| 7,354,174 | B1 | 4/2008 | Yan |
| 7,399,429 | B2 | 7/2008 | Liu et al. |
| 7,482,059 | B2 | 1/2009 | Peng et al. |
| 7,618,162 | B1 | 11/2009 | Parkyn et al. |
| 7,667,225 | B1 | 2/2010 | Lee et al. |
| 7,810,974 | B2 * | 10/2010 | Van Rijswick ........ G02B 6/001 362/555 |
| D629,929 | S | 12/2010 | Chen et al. |
| 8,025,816 | B2 | 9/2011 | Murase et al. |
| 8,240,900 | B2 * | 8/2012 | Van Rijswick ........... F21K 9/66 362/555 |
| 8,455,895 | B2 | 6/2013 | Chai et al. |
| 8,858,027 | B2 | 10/2014 | Takeuchi et al. |
| 8,933,619 | B1 | 1/2015 | Ou |
| 8,981,636 | B2 | 3/2015 | Matsuda et al. |
| 9,016,900 | B2 | 4/2015 | Takeuchi et al. |
| 9,097,396 | B2 * | 8/2015 | Rowlette, Jr. ........... F21K 9/232 |
| 9,234,635 | B2 | 1/2016 | Kwisthout |
| 9,261,242 | B2 | 2/2016 | Ge et al. |
| 9,285,086 | B2 * | 3/2016 | Genier ............... G02B 6/02052 |
| 9,285,104 | B2 | 3/2016 | Takeuchi et al. |
| 9,360,188 | B2 | 6/2016 | Kircher et al. |
| 9,488,767 | B2 | 11/2016 | Nava et al. |
| 9,732,930 | B2 * | 8/2017 | Takeuchi ................ F21V 29/70 |
| 9,761,765 | B2 | 9/2017 | Basin et al. |
| 9,982,854 | B2 | 5/2018 | Ma et al. |
| 10,066,791 | B2 | 9/2018 | Zhang |
| 10,094,517 | B2 | 10/2018 | Xiang |
| 10,094,523 | B2 | 10/2018 | Andrews |
| 10,260,683 | B2 | 4/2019 | Bergmann et al. |
| 10,218,129 | B1 | 5/2019 | Lai et al. |
| 10,281,129 | B1 | 5/2019 | Lai et al. |
| 10,323,799 | B2 | 6/2019 | Huang |

(56) References Cited

U.S. PATENT DOCUMENTS

| | | |
|---|---|---|
| 10,330,297 B2 | 6/2019 | Kwisthout |
| 10,436,391 B2 | 10/2019 | Hsiao et al. |
| 10,544,905 B2 | 1/2020 | Jiang et al. |
| 10,655,792 B2 | 5/2020 | Jiang |
| 10,794,545 B2 | 10/2020 | Jiang et al. |
| 10,868,226 B2 | 12/2020 | Jiang et al. |
| 10,969,063 B2 | 4/2021 | Schlereth et al. |
| 11,143,363 B2 | 10/2021 | Feit |
| 11,215,326 B2 | 1/2022 | Yan et al. |
| 2003/0057444 A1 | 3/2003 | Niki et al. |
| 2004/0008525 A1 | 1/2004 | Shibata |
| 2004/0020424 A1 | 2/2004 | Sellin et al. |
| 2004/0100192 A1 | 5/2004 | Yano et al. |
| 2005/0001227 A1 | 1/2005 | Niki et al. |
| 2005/0205881 A1 | 9/2005 | Yamazoe et al. |
| 2005/0224822 A1 | 10/2005 | Liu |
| 2005/0263778 A1 | 12/2005 | Hata et al. |
| 2006/0046327 A1 | 3/2006 | Shieh et al. |
| 2006/0163595 A1 | 7/2006 | Hsieh et al. |
| 2007/0121319 A1 | 5/2007 | Wolf et al. |
| 2007/0225402 A1 | 9/2007 | Choi et al. |
| 2007/0267976 A1 | 11/2007 | Bohler et al. |
| 2008/0128730 A1 | 6/2008 | Fellows et al. |
| 2008/0137360 A1 | 6/2008 | Van Jijswick et al. |
| 2009/0057704 A1 | 3/2009 | Seo et al. |
| 2009/0122521 A1 | 5/2009 | Hsu |
| 2009/0152586 A1 | 6/2009 | Lee et al. |
| 2009/0184618 A1 | 7/2009 | Hakata et al. |
| 2009/0212698 A1 | 8/2009 | Bailey |
| 2010/0025700 A1 | 2/2010 | Jung et al. |
| 2010/0032694 A1 | 2/2010 | Kim et al. |
| 2010/0047943 A1 | 2/2010 | Lee et al. |
| 2010/0053930 A1 | 3/2010 | Kim et al. |
| 2010/0135009 A1 | 6/2010 | Duncan et al. |
| 2010/0200885 A1 | 8/2010 | Hsu et al. |
| 2010/0265711 A1 | 10/2010 | Lee |
| 2011/0001148 A1 | 1/2011 | Sun et al. |
| 2011/0025205 A1 | 2/2011 | Van Rijswick et al. |
| 2011/0026242 A1 | 2/2011 | Ryu et al. |
| 2011/0031891 A1 | 2/2011 | Lee et al. |
| 2011/0037397 A1 | 2/2011 | Lee et al. |
| 2011/0043592 A1 | 2/2011 | Kinoshita et al. |
| 2011/0049472 A1 | 3/2011 | Kim et al. |
| 2011/0050073 A1 | 3/2011 | Huang |
| 2011/0156086 A1 | 6/2011 | Kim et al. |
| 2011/0210330 A1 | 9/2011 | Yang |
| 2011/0210358 A1* | 9/2011 | Kim ..................... H01L 33/505 |
| | | 257/98 |
| 2011/0273863 A1 | 11/2011 | Cai et al. |
| 2011/0278605 A1 | 11/2011 | Agatani et al. |
| 2011/0303927 A1 | 12/2011 | Sanpei et al. |
| 2012/0119647 A1 | 5/2012 | Hsu |
| 2012/0145992 A1 | 6/2012 | Yoo et al. |
| 2012/0161193 A1 | 6/2012 | Hassan |
| 2012/0162965 A1 | 6/2012 | Takeuchi et al. |
| 2012/0169251 A1 | 7/2012 | Lai et al. |
| 2012/0175667 A1 | 7/2012 | Golle et al. |
| 2012/0182757 A1 | 7/2012 | Liang et al. |
| 2012/0256238 A1 | 10/2012 | Ning et al. |
| 2012/0256538 A1 | 10/2012 | Takeuchi et al. |
| 2012/0268936 A1 | 10/2012 | Pickard et al. |
| 2012/0273812 A1 | 11/2012 | Takahashi et al. |
| 2012/0281411 A1 | 11/2012 | Kajiya et al. |
| 2012/0293721 A1 | 11/2012 | Ueyama |
| 2013/0003346 A1 | 1/2013 | Letoquin et al. |
| 2013/0009179 A1 | 1/2013 | Bhat et al. |
| 2013/0058080 A1 | 3/2013 | Ge et al. |
| 2013/0058580 A1 | 3/2013 | Ge et al. |
| 2013/0099271 A1 | 4/2013 | Hakata et al. |
| 2013/0147348 A1 | 6/2013 | Motoya et al. |
| 2013/0169174 A1 | 7/2013 | Lee et al. |
| 2013/0215625 A1* | 8/2013 | Takeuchi ................. F21K 9/232 |
| | | 362/363 |
| 2013/0235592 A1 | 9/2013 | Takeuchi et al. |
| 2013/0249381 A1 | 9/2013 | Takeuchi et al. |
| 2013/0264591 A1 | 10/2013 | Hussell |
| 2013/0264592 A1 | 10/2013 | Bergmann et al. |
| 2013/0265796 A1 | 10/2013 | Kwisthout |
| 2013/0271989 A1* | 10/2013 | Hussell ................... F21K 9/232 |
| | | 362/249.02 |
| 2013/0277705 A1 | 10/2013 | Seo et al. |
| 2013/0293098 A1 | 11/2013 | Li et al. |
| 2013/0301252 A1 | 11/2013 | Hussell et al. |
| 2013/0322072 A1 | 12/2013 | Pu et al. |
| 2014/0022788 A1 | 1/2014 | Dan et al. |
| 2014/0035123 A1 | 2/2014 | Seiji et al. |
| 2014/0049164 A1 | 2/2014 | McGuire et al. |
| 2014/0071696 A1 | 3/2014 | Park et al. |
| 2014/0096901 A1 | 4/2014 | Hsieh et al. |
| 2014/0103376 A1 | 4/2014 | Ou et al. |
| 2014/0103794 A1 | 4/2014 | Ueda et al. |
| 2014/0141283 A1 | 5/2014 | Lee et al. |
| 2014/0152177 A1* | 6/2014 | Matsuda ................. F21K 9/232 |
| | | 315/32 |
| 2014/0175465 A1 | 6/2014 | Lee et al. |
| 2014/0185269 A1 | 7/2014 | Li |
| 2014/0197440 A1 | 7/2014 | Ye et al. |
| 2014/0217558 A1 | 8/2014 | Tamemoto |
| 2014/0218892 A1 | 8/2014 | Edwards et al. |
| 2014/0225514 A1 | 8/2014 | Pickard |
| 2014/0228914 A1 | 8/2014 | van de Ven et al. |
| 2014/0268779 A1 | 9/2014 | Sorensen et al. |
| 2014/0362565 A1 | 12/2014 | Yao et al. |
| 2014/0369036 A1 | 12/2014 | Feng |
| 2015/0014732 A1 | 1/2015 | DeMille et al. |
| 2015/0022114 A1 | 1/2015 | Kim |
| 2015/0069442 A1 | 3/2015 | Liu et al. |
| 2015/0070871 A1 | 3/2015 | Chen et al. |
| 2015/0085485 A1 | 3/2015 | Park |
| 2015/0085489 A1 | 3/2015 | Anderson |
| 2015/0171287 A1 | 6/2015 | Matsumura et al. |
| 2015/0197689 A1 | 7/2015 | Tani et al. |
| 2015/0211723 A1 | 7/2015 | Athalye |
| 2015/0221822 A1 | 8/2015 | Kim et al. |
| 2015/0255440 A1 | 9/2015 | Hsieh |
| 2015/0312990 A1 | 10/2015 | van de Ven et al. |
| 2015/0340347 A1 | 11/2015 | Jung et al. |
| 2016/0056334 A1 | 2/2016 | Jang et al. |
| 2016/0064628 A1 | 3/2016 | Fujii et al. |
| 2016/0087003 A1 | 3/2016 | Lee et al. |
| 2016/0116120 A1 | 4/2016 | Kwisthout |
| 2016/0197243 A1 | 7/2016 | Lee et al. |
| 2016/0238199 A1 | 8/2016 | Yeung et al. |
| 2016/0348853 A1 | 12/2016 | Tanda et al. |
| 2016/0369952 A1 | 12/2016 | Weekamp |
| 2016/0372647 A1 | 12/2016 | Seo et al. |
| 2016/0377237 A1 | 12/2016 | Zhang |
| 2017/0012177 A1 | 1/2017 | Trottier |
| 2017/0016582 A1 | 1/2017 | Yang et al. |
| 2017/0040504 A1 | 2/2017 | Chen et al. |
| 2017/0051877 A1 | 2/2017 | Weijers et al. |
| 2017/0122498 A1 | 5/2017 | Zalka et al. |
| 2017/0122499 A1 | 5/2017 | Lin et al. |
| 2017/0138542 A1 | 5/2017 | Gielen et al. |
| 2017/0138543 A1 | 5/2017 | Steele et al. |
| 2017/0167663 A1 | 6/2017 | Hsiao et al. |
| 2017/0167711 A1 | 6/2017 | Kadijk |
| 2017/0299125 A1 | 10/2017 | Takeuchi et al. |
| 2017/0299126 A1 | 10/2017 | Takeuchi et al. |
| 2017/0330868 A1 | 11/2017 | Pu et al. |
| 2018/0045380 A1 | 2/2018 | Li et al. |
| 2018/0080612 A1 | 3/2018 | Haberkorn et al. |
| 2018/0106435 A1 | 4/2018 | Wu et al. |
| 2018/0172218 A1 | 6/2018 | Feit |
| 2018/0230374 A1 | 8/2018 | Ito et al. |
| 2019/0032858 A1 | 1/2019 | Cao et al. |
| 2019/0049073 A1* | 2/2019 | Eckert ................... F21K 9/232 |
| 2019/0137047 A1 | 5/2019 | Hu |
| 2019/0139943 A1 | 5/2019 | Tiwari et al. |
| 2019/0186697 A1 | 6/2019 | Jiang et al. |
| 2019/0195434 A1 | 6/2019 | Jiang et al. |
| 2019/0219231 A1 | 7/2019 | Jiang et al. |
| 2019/0219232 A1 | 7/2019 | Takeuchi et al. |
| 2019/0242532 A1 | 8/2019 | Jiang et al. |

(56) References Cited

U.S. PATENT DOCUMENTS

| | | |
|---|---|---|
| 2019/0264874 A1 | 8/2019 | Jiang et al. |
| 2019/0264875 A1 | 8/2019 | Jiang et al. |
| 2019/0264876 A1 | 8/2019 | Jiang et al. |
| 2019/0271443 A1 | 9/2019 | Jiang et al. |
| 2019/0277483 A1 | 9/2019 | Kwisthout |
| 2019/0277484 A1 | 9/2019 | Kwisthout |
| 2019/0301683 A1 | 10/2019 | Jiang et al. |
| 2019/0301684 A1 | 10/2019 | Jiang et al. |
| 2019/0309907 A1 | 10/2019 | Jiang et al. |
| 2019/0315921 A1 | 10/2019 | Saito et al. |
| 2019/0368667 A1 | 12/2019 | On et al. |
| 2020/0035876 A1 | 1/2020 | Jiang et al. |
| 2020/0049315 A1 | 2/2020 | Wu et al. |
| 2020/0144230 A1 | 5/2020 | Lin et al. |
| 2020/0176646 A1 | 6/2020 | Li |
| 2021/0148533 A1 | 5/2021 | Van Bommel et al. |

FOREIGN PATENT DOCUMENTS

| | | |
|---|---|---|
| CN | 201386926 Y | 1/2010 |
| CN | 201448620 U | 5/2010 |
| CN | 101826588 A | 9/2010 |
| CN | 102121576 A | 7/2011 |
| CN | 102209625 A | 10/2011 |
| CN | 202209551 U | 5/2012 |
| CN | 202252991 U | 5/2012 |
| CN | 202253168 U | 5/2012 |
| CN | 102751274 A | 10/2012 |
| CN | 202473919 U | 10/2012 |
| CN | 202719450 U | 2/2013 |
| CN | 101968181 B | 3/2013 |
| CN | 102958984 A | 3/2013 |
| CN | 102969320 A | 3/2013 |
| CN | 202834823 U | 3/2013 |
| CN | 103123949 A | 5/2013 |
| CN | 203131524 U | 8/2013 |
| CN | 103335226 A | 10/2013 |
| CN | 203367275 U | 12/2013 |
| CN | 103542308 A | 1/2014 |
| CN | 103560128 A | 2/2014 |
| CN | 103682042 A | 3/2014 |
| CN | 203477967 U | 3/2014 |
| CN | 103872224 A | 6/2014 |
| CN | 103890481 A | 6/2014 |
| CN | 203628311 U | 6/2014 |
| CN | 203628391 U | 6/2014 |
| CN | 203628400 U | 6/2014 |
| CN | 203656627 U | 6/2014 |
| CN | 203671312 U | 6/2014 |
| CN | 103939758 A | 7/2014 |
| CN | 103956421 A | 7/2014 |
| CN | 103972364 A | 8/2014 |
| CN | 103994349 A | 8/2014 |
| CN | 203771136 U | 8/2014 |
| CN | 203857313 U | 10/2014 |
| CN | 203880468 U | 10/2014 |
| CN | 203907265 U | 10/2014 |
| CN | 203910792 U | 10/2014 |
| CN | 203932049 U | 11/2014 |
| CN | 203940268 U | 11/2014 |
| CN | 204062539 U | 12/2014 |
| CN | 104295945 A | 1/2015 |
| CN | 104319345 A | 1/2015 |
| CN | 204083941 U | 1/2015 |
| CN | 204088366 U | 1/2015 |
| CN | 204153513 U | 2/2015 |
| CN | 104456165 A | 3/2015 |
| CN | 204289439 U | 4/2015 |
| CN | 104600174 A | 5/2015 |
| CN | 104600181 A | 5/2015 |
| CN | 204328550 U | 5/2015 |
| CN | 104716247 A | 6/2015 |
| CN | 204387765 U | 6/2015 |
| CN | 204459844 U | 7/2015 |
| CN | 204494343 U | 7/2015 |
| CN | 104913217 A | 9/2015 |
| CN | 104979455 A | 10/2015 |
| CN | 105042354 A | 11/2015 |
| CN | 105090789 A | 11/2015 |
| CN | 105098032 A | 11/2015 |
| CN | 105140381 A | 12/2015 |
| CN | 105161608 A | 12/2015 |
| CN | 105226167 A | 1/2016 |
| CN | 204986570 U | 1/2016 |
| CN | 105371243 A | 3/2016 |
| CN | 205081145 U | 3/2016 |
| CN | 105609621 A | 5/2016 |
| CN | 205264758 U | 5/2016 |
| CN | 205350910 U | 6/2016 |
| CN | 105789195 A | 7/2016 |
| CN | 106060630 A | 10/2016 |
| CN | 106468405 A | 3/2017 |
| CN | 106898681 A | 6/2017 |
| CN | 106939973 A | 7/2017 |
| CN | 107035979 A | 8/2017 |
| CN | 107123641 A | 9/2017 |
| CN | 107170733 A | 9/2017 |
| CN | 107204342 A | 9/2017 |
| CN | 206563190 U | 10/2017 |
| CN | 107314258 A | 11/2017 |
| CN | 206973307 U | 2/2018 |
| CN | 207034659 U | 2/2018 |
| CN | 108039402 A | 5/2018 |
| CN | 105090782 B | 7/2018 |
| CN | 207849021 U | 9/2018 |
| CN | 109155306 A | 1/2019 |
| CN | 209354987 U | 9/2019 |
| CN | 111550687 A | 8/2020 |
| EP | 2535640 A1 | 12/2012 |
| EP | 2631958 A1 | 8/2013 |
| EP | 2760057 A1 | 7/2014 |
| EP | 2567145 B1 | 4/2016 |
| GB | 2547085 A | 8/2017 |
| JP | 3075689 U | 2/2001 |
| JP | 2001126510 A | 5/2001 |
| JP | 2003037239 A | 2/2003 |
| JP | 2006202500 A | 8/2006 |
| JP | 2010062005 A | 3/2010 |
| JP | 2012099726 A | 5/2012 |
| JP | 2013021346 A | 1/2013 |
| JP | 2013225587 A | 10/2013 |
| KR | 20140132517 A | 11/2014 |
| WO | 2012053134 A1 | 4/2012 |
| WO | 2014012346 A1 | 1/2014 |
| WO | 2014167458 A1 | 10/2014 |
| WO | 2017037010 A1 | 3/2017 |
| WO | 2017085063 A1 | 5/2017 |

* cited by examiner

LED FILAMENT AND LED LIGHT BULB

CROSS-REFERENCE TO RELATED APPLICATION

This application claims priority to Chinese Patent Applications No. 201910497661.2 filed on Jun. 10, 2019, which is hereby incorporated by reference in its entirety.

This application is a continuation-in-part application of U.S. application Ser. No. 16/748,070 filed on Jan. 21, 2020, which is a continuation-in-part application of U.S. application Ser. No. 16/234,124 filed on Dec. 27, 2018, which is a continuation-in-part application of U.S. application Ser. No. 15/858,036 filed on Dec. 29, 2017.

The application Ser. No. 15/858,036 is a continuation-in-part application of U.S. application Ser. No. 15/499,143 filed on Apr. 27, 2017.

The application Ser. No. 15/858,036 is a continuation-in-part application of U.S. application Ser. No. 15/723,297 filed on Oct. 3, 2017.

The application Ser. No. 15/858,036 is a continuation-in-part application of U.S. application Ser. No. 29/619,287 filed on Sep. 28, 2017.

The application Ser. No. 15/858,036 is a continuation-in-part application of U.S. application Ser. No. 29/627,379 filed on Nov. 27, 2017.

The application Ser. No. 16/234,124 claims priority to Chinese Patent Applications No. 201510502630.3 filed on Aug. 17, 2015; No. 201510966906.3 filed on Dec. 19, 2015; No. 201610041667.5 filed on Jan. 22, 2016; No. 201610272153.0 filed on Apr. 27, 2016; No. 201610394610.3 filed on Jun. 3, 2016; No. 201610586388.7 filed on Jul. 22, 2016; No. 201610544049.2 filed on Jul. 7, 2016; No. 201610936171.4 filed on Nov. 1, 2016; No. 201611108722.4 filed on Dec. 6, 2016; No. 201610281600.9 filed on Apr. 29, 2016; No. 201710024877.8 filed on Jan. 13, 2017; No. 201710079423.0 filed on Feb. 14, 2017; No. 201710138009.2 filed on Mar. 9, 2017; No. 201710180574.5 filed on Mar. 23, 2017; No. 201710234618.8 filed on Apr. 11, 2017; No. 201410510593.6 filed on Sep. 28, 2014; No. 201510053077.X filed on Feb. 2, 2015; No. 201510316656.9 filed on Jun. 10, 2015; No. 201510347410.8 filed on Jun. 19, 2015; No. 201510489363.0 filed on Aug. 7, 2015; No. 201510555889.4 filed on Sep. 2, 2015; No. 201710316641.1 filed on May 8, 2017; No. 201710839083.7 filed on Sep. 18, 2017; No. 201710883625.0 filed on Sep. 26, 2017; No. 201730450712.8 filed on Sep. 21, 2017; No. 201730453239.9 filed on Sep. 22, 2017; No. 201730453237.X filed on Sep. 22, 2017; No. 201730537542.7 filed on Nov. 3, 2017; No. 201730537544.6 filed on Nov. 3, 2017; No. 201730520672.X filed on Oct. 30, 2017; No. 201730517887.6 filed on Oct. 27, 2017; No. 201730489929.X filed on Oct. 16, 2017; No. 201711434993.3 filed on Dec. 26, 2017; No. 201711477767.3 filed on Dec. 29, 2017; No. 201810031786.1 filed on Jan. 12, 2018; No. 201810065369.9 filed on Jan. 23, 2018; No. 201810343825.1 filed on Apr. 17, 2018; No. 201810344630.9 filed on Apr. 17, 2018; No. 201810501350.4 filed on May 23, 2018; No. 201810498980.0 filed on May 23, 2018; No. 201810573314.9 filed on Jun. 6, 2018; No. 201810836433.9 filed on Jul. 26, 2018; No. 201810943054.X filed on Aug. 17, 2018; No. 201811005536.7 filed on Aug. 30, 2018; No. 201811005145.5 filed on Aug. 30, 2018; No. 201811079889.1 filed on Sep. 17, 2018; No. 201811277980.4 filed on Oct. 30, 2018; No. 201811285657.1 filed on Oct. 31, 2018; No. 201811378173.1 filed on Nov. 19, 2018; No. 201811378189.2 filed on Nov. 19, 2018; No. 201811549205.X filed on Dec. 18, 2018, each of which is hereby incorporated by reference in its entirety.

BACKGROUND

Technical Field

The present invention relates to lighting fields, and more particularly to an LED filament and an LED light bulb having the LED filament.

Related Art

LEDs have the advantages of environmental protection, energy saving, high efficiency, and long lifespan. Therefore, it has been generally valued in recent years and gradually replaced the position of traditional lighting fixtures. However, the lighting of the traditional LEDs is directional, and unlike traditional lighting fixtures, which can make a wide-angle illumination. Therefore, applying LEDs to traditional lighting fixtures, depending on the types of the lighting fixtures, still has challenges.

In recent years, an LED filament that can make an LED light source resemble a traditional tungsten filament bulb and achieve 360° full-angle lighting has received increasing attention from the industry. This kind of LED filament is made by fixing a plurality of LED chips in series on a narrow and slender glass substrate, and then wrapping the entire glass substrate with silica gel doped with a phosphor or phosphors, and then forming electrical connection. In addition, there is one kind of LED soft filament, which is similar to the structure of the above-mentioned LED filament and is employed a flexible printed circuit substrate (hereinafter referred to FPC) instead of the glass substrate to enable the LED filament having a certain degree of bending. However, the soft filaments made by FPC have disadvantages. For example, since the FPC's thermal expansion coefficient is different from that of the silicone-covered filament, long-term use will cause the LED chip to displacement or even degumming; furthermore, the FPC may not beneficial to flexible adjustment of the process conditions and the like.

The applicant has previously disclosed a soft filament, for example, in some of the embodiments of Chinese Patent Publication No. CN106468405A, which provides a soft filament structure without a carrier substrate, and in the application, the traditional structure that needs the chip to be mounted on the substrate before coating phosphor or packaging is replaced by a flexible fluorescent package with a wavelength conversion effect. However, some of the filament structures have challenges related to the stability of metal wiring between the chips while they are being bent. If the arrangement of chips in the filament is dense, since the stress is too concentrated on a specific part of the filament upon the filament is in a bent configuration, when adjacent LED chips are connected by metal wiring, the metal wire connected to the LED chips would be damaged or even broken easily. Therefore, some embodiments in the application still have room for improvement in quality.

Most LED lights known to the inventor(s) use a combination of blue LED chips and yellow phosphors to emit white light, but the emission spectrum of LED lights in the red light region is weaker, and the color rendering index is lower. Therefore, it is difficult for the traditional LED lights to achieve a low color temperature. To increase the color rendering index, generally a certain amount of green phosphor and red phosphor is added; however, the relative conversion rate of red phosphor is lower, leading to a reduction in the overall luminous flux of the LED lights. That is, a decrease in light efficiency.

This application further optimizes the aforementioned applications to fit various kinds of processes and product requirements.

Furthermore, the LED filament is generally disposed inside the LED light bulb, and in order to present the aesthetic appearance and to make the illumination of the LED filament more uniform and widespread, the LED filament is bent to have a plurality of curves. However, since the LED chips are arranged in the LED filaments, and the LED chips are relatively harder objects, the LED filaments can hardly be bent into a desired shape. Moreover, the LED filament is also prone to have cracks due to stress concentration during bending.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

It is an object of the claimed invention to provide an LED filament, including:
a conductive section, including a conductor;
at least two LED sections connected to each other by the conductive section, and each of the LED sections comprising at least two LED chips electrically connected to each other through a wire;
two electrodes electrically connected to the LED section; and
a light conversion layer with a top layer and a base layer covering the at least two LED sections, the conductive section and the two electrodes, and a part of each of the two electrodes is exposed respectively; wherein the LED filament is supplied with electric power no more than 8 W, when the LED filament is lit, at least 4 lm of white light is emitted per millimeter of filament length of the LED filament.

In accordance with an embodiment with the present invention, the top layer includes a phosphor composition that includes a first phosphor, a second phosphor, a third phosphor, and a fourth phosphor, where the weight percentage of each phosphor in the phosphor composition is as follow: the first phosphor is 5.45-5.55%, the second phosphor is 70-88%, the third phosphor is 0.6-7%, and the fourth phosphor is the rest amount of the phosphor.

In accordance with an embodiment with the present invention, the top layer includes a glue where a weight ratio of the phosphor composition to the glue in the top layer is from 0.2:1 to 0.3:1.

In accordance with an embodiment with the present invention, a peak wavelength of the first phosphor under an excitation of blue light is 490-500 nm, and an full width at half maximum (FWHM) is 29-32 nm; while a peak wavelength of the second phosphor under the excitation of blue light is 520-540 nm, and an FWHM is 110-115 nm.

In accordance with an embodiment with the present invention, each millimeter of filament length includes at least two LED chips, and in a 25° C. ambient environment, a temperature of the LED filament is no greater than a junction temperature after the LED filament is lit for 15,000 hours.

In accordance with an embodiment with the present invention, the LED filament includes a plurality of the LED sections, and each of the LED sections includes a plurality of the LED chips, a shortest distance between two LED chips of the LED chips located respectively in two adjacent LED sections is greater than a distance between two adjacent LED chips of the LED chips in the same LED section.

In accordance with an embodiment with the present invention, a length of the wire is shorter than a length of the conductor.

It is another object of the claimed invention to provide an LED light bulb, comprising:
a lamp housing, filled with gas including nitrogen and oxygen, where the oxygen content is 1% to 5% of the volume of the lamp housing;
a bulb base connected to the lamp housing;
a stem connected to the bulb base and located in the lamp housing; and
a single LED filament, disposed in the lamp housing and the LED filament comprising:
a conductive section, comprising a conductor;
at least two LED sections connected to each other by the conductive section, and each of the LED sections comprising at least two LED chips electrically connected to each other through a wire;
two electrodes, electrically connected to the LED section; and
a light conversion layer with a top layer and a base layer, covering the at least two LED sections, the conductive section and the two electrodes, and a part of each of the two electrodes is exposed respectively; wherein the LED filament is supplied with electric power no more than 8 W, when the LED filament is lit, at least 4 lm of white light is emitted per millimeter of filament length;
a Cartesian coordinate system having a x-axis, a y-axis and a-z-axis is oriented for the LED light bulb, where the z-axis is parallel to the stem, wherein W1 is the diameter of the bulb base, W2 is the maximum diameter of the lamp housing or the maximum horizontal distance between the lamp housing in the Y-Z plane, and W3 is the maximum width of the LED filament in the y-axis direction on the Y-Z plane or the maximum width in the x-axis direction on the X-Z plane, where W1<W3<W2.

In accordance with an embodiment with the present invention, the LED filament has at least two first bending points and at least one second bending point when the LED filament is bent. In accordance with an embodiment with the present invention, the at least two first bending points and the at least one second bending point are arranged alternately.

In accordance with an embodiment with the present invention, a height of any one of the at least two first bending points on the Z-axis is greater than a height of any one of the at least one second bending point.

In accordance with an embodiment with the present invention, the LED filament has a plurality of the first bending points, distances between any of two adjacent first bending points of the first bending points on the Y-axis are equal or distances between any of two adjacent first bending points of the first bending points on the Z-axis are equal.

In accordance with an embodiment with the present invention, the LED filament has a plurality of the first bending points, a distance between two adjacent first bending points of the first bending points on the Y-axis has a maximum value D1 and a minimum value D2, or a distance between two adjacent first bending points of the first bending points on the X-axis has the maximum value D1 and the minimum value D2, wherein the range of D2 is from 0.5 D1 to 0.9 D1.

In accordance with an embodiment with the present invention, the LED filament include one conductor section and two LED sections, where a bending point of each of the two LED sections and each of the two electrodes are located substantially on a circumference of a circle taking the conductor section as a center.

In accordance with an embodiment with the present invention, the LED filament includes a plurality of the LED sections, and each of the LED sections includes a plurality of the LED chips, a shortest distance between two LED chips of the LED chips located respectively in two adjacent LED sections is greater than a distance between two adjacent LED chips of the LED chips in the same LED section.

In accordance with an embodiment with the present invention, a length of the wire is shorter than a length of the conductor.

In accordance with an embodiment with the present invention, an impurity is attached to the inner wall of the lamp housing, where the average thickness of the impurity deposited per square centimeter of an inner wall area of the lamp housing is 0.01 to 2 mm.

In accordance with an embodiment with the present invention, a spectral distribution of the light bulb is between wavelength range of about 400 nm to 800 nm, and three peak wavelengths P1, P2, P3 are appeared in the wavelength ranges corresponding to light emitted by the light bulb, the wavelength of the peak P1 is between 430 nm and 480 nm, the wavelength of the peak P2 is between 580 nm and 620 nm, and the wavelength of the peak P3 is between 680 nm and 750 nm, wherein a light intensity of the peak P1 is less than that of the peak P2, and the light intensity of the peak P2 is less than that of the peak P3.

BRIEF DESCRIPTION OF THE DRAWINGS

The disclosure will become more fully understood from the detailed description given herein below for illustration only, and thus not limitative of the disclosure, wherein.

DETAILED DESCRIPTION

In order to make the abovementioned objects, features, and advantages of the present invention more comprehensible, specific embodiments of the present invention will be described in detail below with reference to the accompanying drawings.

Figure 1:
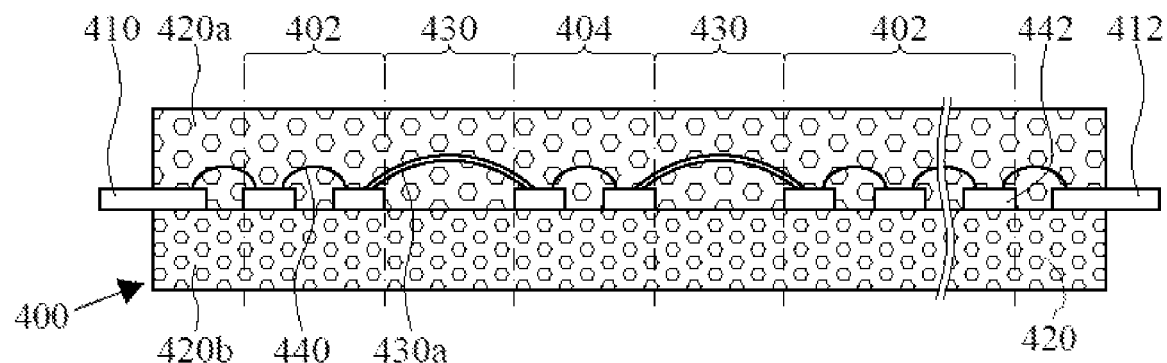
FIG. 1 illustrates a structural schematic view of an LED filament according to an embodiment of the present invention.

FIG. 1 is a schematic structural view of an embodiment of an LED filament of the present invention. As shown in FIG. 1, the LED filament 400 includes a light conversion layer 420, LED sections 402 and 404, electrodes 410 and 412, and a conductor section 430 located between the LED sections 402 and 404. The LED sections 402 and 404 include at least two LED chips 442, and the LED chips 442 are electrically connected to each other through a wire 440. In this embodiment, the conductor section 430 includes a conductor 430a connected to the LED sections 402 and 404. The shortest distance between the two LED chips 442 located respectively in two adjacent LED sections 402 and 404 is greater than the distance between the two adjacent LED chips 442 in the LED sections 402/404. The length of the wire 440 is shorter than the length of the conductor 430a. Therefore, when a bending portion is formed between the two LED sections 402 and 404, it can be ensured that the generated stress will not cause the conductor section 430 to break. The light conversion layer 420 is coated on at least two sides of the LED chip 442/the electrodes 410 and 412. The light conversion layer 420 exposes a part of the electrodes 410 and 412. The light conversion layer 420 may have at least one top layer 420a and one base layer 420b serving as an upper layer and a lower layer of the LED filament, respectively. In this embodiment, the top layer 420a and the base layer 420b are located on two sides of the LED chip 442/electrodes 410 and 412, respectively. In one embodiment, if the LED filament is supplied with electric power no more than 8 Watts (W), when the LED filament is lit, at least 4 lumen (lm) of white light is emitted per millimeter of filament length. In one embodiment, each millimeter of filament length includes at least two LED chips. In a 25° C. ambient environment, the temperature of the LED filament is no greater than the junction temperature after the LED filament is lit for 15,000 hours.

In one embodiment, a silicone-modified polyimide resin composition composite film is served as a base layer 420b of the LED filament. In one embodiment, the amidation reaction is carried out under a nitrogen atmosphere or a vacuum defoaming method or both is employed in the synthesis of the silicone-modified polyimide resin composition, so that the volume percentage of the cells in the composite film of the silicone-modified polyimide resin composition is 5~20%, preferably 5~10%. In one embodiment, the surface of the base layer 420b may be treated with a silicone resin or a titanate coupling agent. After the surface of the base layer 420b is treated, the cells may contain the silicone resin or the titanate coupling agent.

The phosphor composition that serves as a part of the top layer 420a includes a first phosphor, a second phosphor, a third phosphor, and a fourth phosphor. The peak wavelength of the first phosphor under the excitation of blue light is 490-500 nm, and the full width at half maximum (FWHM) is 29-32 nm. The peak wavelength of the second phosphor under the excitation of blue light is 520-540 nm, and the FWHM is 110-115 nm. The peak wavelength of the third phosphor under the blue light excitation is 660-672 nm, and the FWHM is 15-18 nm. The peak wavelength of the fourth phosphor under the excitation of blue light is 600-612 nm, and the FWHM is 72-75 nm; alternatively, the peak wavelength of the fourth phosphor under the excitation of blue light is 620-628 nm, and the FWHM is 16-18 nm; or, the peak wavelength of the fourth phosphor under the excitation of blue light is 640-650 nm, and the FWHM is 85-90 nm. The center particle diameter (D50) of any one of the group of the first phosphor, the second phosphor, the third phosphor, and the fourth phosphor ranges from 15 μm to 20 μm. Preferably, in one embodiment, the range of the D50 of the second phosphor and the third phosphor is from 15 to 16 μm, and the range of D50 of the first phosphor and the fourth phosphor is from 16 to 20 μm. When the blue light excites the phosphor, the different thickness of the top layer with consistent phosphor concentration will affect the full width at half maximum of the phosphor. In this embodiment, the thickness of the top layer 420a is 80-100 μm. The weight percentage of each phosphor in the phosphor composition is as follow: the first phosphor is 5.45-5.55%, the second phosphor is 70-88%, the third phosphor is 0.6-7%, and the fourth phosphor is the rest amount of the phosphor. The top layer is prepared at a certain ratio of phosphors to glue, phosphors with different peak wavelengths are selected, and the light performance is measured under the condition using a blue LED chip with a peak wavelength of 451 nm and a FWHM of 16.3 nm and utilizing a current of 30 mA. The results of light performance of different phosphor compositions are shown in Table 1 as below:

TABLE 1

| | Contents (%) | | | | |
|---|---|---|---|---|---|
| | First phosphor | Second phosphor | Third phosphor | Fourth phosphor | |
| No. | 495 nm | 535 nm | 670 nm | 630 nm | 652 nm |
| 1 | 5.49 | 72.55 | 0.83 | | 21.13 |
| 2 | 5.49 | 72.55 | 2.54 | | 15.45 |
| 3 | 5.51 | 85.83 | 5.04 | 3.62 | |
| 4 | 5.51 | 85.83 | 4.63 | 3.59 | |

| No. | Total phosphor contents to glue ratio (%) | Eff (lm/w) | Ra | R9 | CCT (K) |
|---|---|---|---|---|---|
| 1 | 27.4 | 103.5 | 94.7 | 93.0 | 2641 |
| 2 | 27.4 | 107.0 | 92.8 | 81.9 | 2683 |
| 3 | 27.6 | 102.0 | 97.0 | 91.5 | 2621 |
| 4 | 27.6 | 106.8 | 97.1 | 84.9 | 2670 |

It can be known from No. 1 to No. 4 of the top layers 420a in Table 1 that, the content of the third phosphor and the fourth phosphor in the phosphor composition will affect the light effect (Eff), the average color rendering index (Ra), and the saturated red color (R9). It can be known from compositions No. 1 and No. 2 that, when the content of the fourth phosphor with a peak wavelength of 670 nm increases, the Eff will increase, but Ra and R9 will decrease. As can be seen from No. 3 and No. 4 in Table 1, when the content of the fourth phosphor having a peak wavelength of 670 nm increases, the Eff will decrease, but Ra and R9 will increase. Therefore, when the fourth phosphor with different wavelength peaks is selected according to actual demands, the amounts of the third phosphor and the fourth phosphor may be adjusted to obtain better luminous performance.

Ratio Between Phosphors and Glue

Using the same phosphor, the ratio of the phosphor composition to the glue is adjusted and as shown in Table 2. As shown in Table 2, when the ratio of the phosphor composition to the glue is different, the Eff, the Ra, the R9, and the Correlated Color Temperature (CCT) will be different as well. When the ratio of the phosphor composition to the glue is more, the Eff, the Ra, and the CCT will decrease, and the R9 decreases first and then increases. Moreover, when utilizing the phosphor composition accompanied with a glue (such as silica gel) to form the top layer of the LED filament, since the specific weight of the phosphor composition is greater than that of the silica gel, apparent precipitation of the phosphor will occur during the manufacturing process of the top layer, causing the white LED color temperature to drift. The more ratio of the phosphor composition to the glue, the more produced precipitation of the phosphor, resulting in a more severe color temperature drift. Therefore, the weight ratio of the phosphor composition to the glue in the top layer is from 0.2:1 to 0.3:1, preferably, in one embodiment, from 0.25:1 to 0.3:1. In one embodiment, a certain amount of hollow glass microbeads can be added into the phosphor composition. When the phosphor precipitates, the glass microbeads will float, and during the floating process, the extent of backscattering/emission of light is reduced. Thus, the effect of light scattering resulting from the phosphor precipitation will be offset, and therefore the color temperature drift phenomenon can be alleviated. In addition, since the microbeads absorb less visible light, the addition of the glass microbeads has little impact on the initial brightness of white light LEDs. The mass ratio of the glass microbeads to the phosphor composition is 1:5 to 1:15, and in one embodiment the weight ratio of the glass microbeads to the phosphor composition is preferably 1:10 to 1:15.

TABLE 2

| | Contents (%) | | | | |
|---|---|---|---|---|---|
| | First phosphor | Second phosphor | | Third phosphor | Fourth phosphor |
| No. | 495 nm | 500 nm | 535 nm | 670 nm | 600 nm |
| 1 | 4.01 | 7.12 | 77.44 | 5.20 | 6.23 |
| 2 | 4.03 | 7.10 | 77.46 | 5.19 | 6.22 |
| 3 | 4.02 | 7.12 | 77.47 | 5.14 | 6.25 |

| No. | Total phosphor contents to glue ratio (%) | Eff (lm/w) | Ra | R9 | CCT (K) |
|---|---|---|---|---|---|
| 1 | 27.2 | 102.9 | 99.0 | 98.7 | 2718 |
| 2 | 35.2 | 91.9 | 98.6 | 98.5 | 2342 |
| 3 | 40.2 | 82.2 | 97.9 | 99.0 | 2128 |

In one embodiment, an LED filament is provided, and the provided LED filament is made of the aforementioned phosphor composition with a blue light chip. The blue light chip has a wavelength peak of 450 to 500 nm and a full width at half maximum of 15 to 18 nm.

Figure 2A:
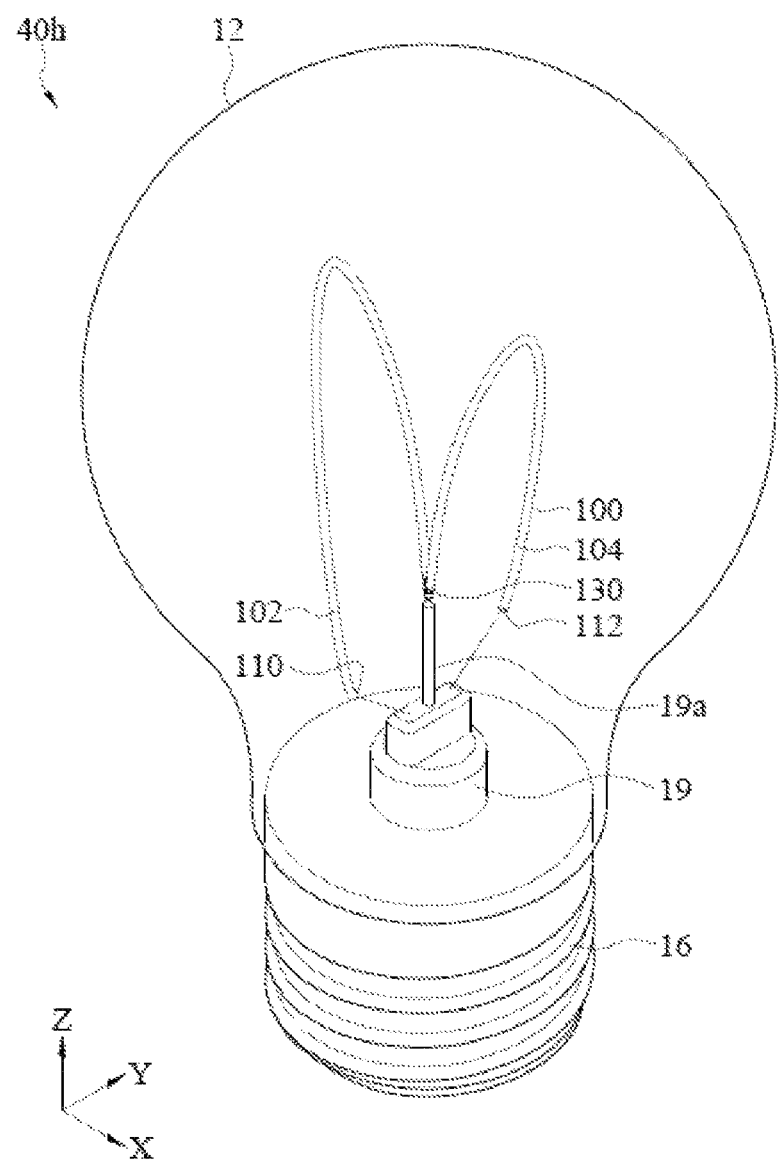
FIGS. 2A to 2D illustrate a perspective view, a side view, another side view, and a top view of an LED filament according to an embodiment of the present invention.
Figure 2B:
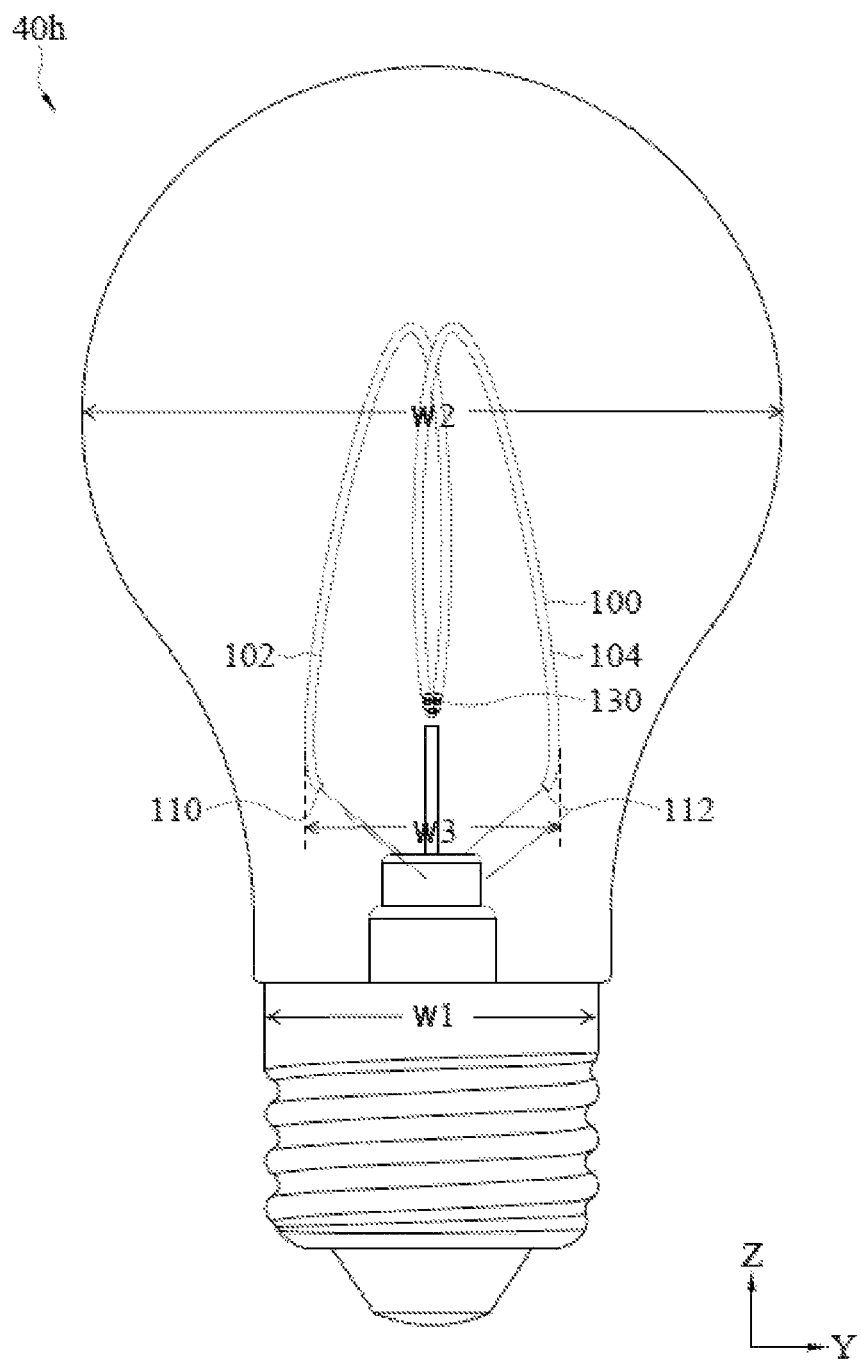
Figure 2C:
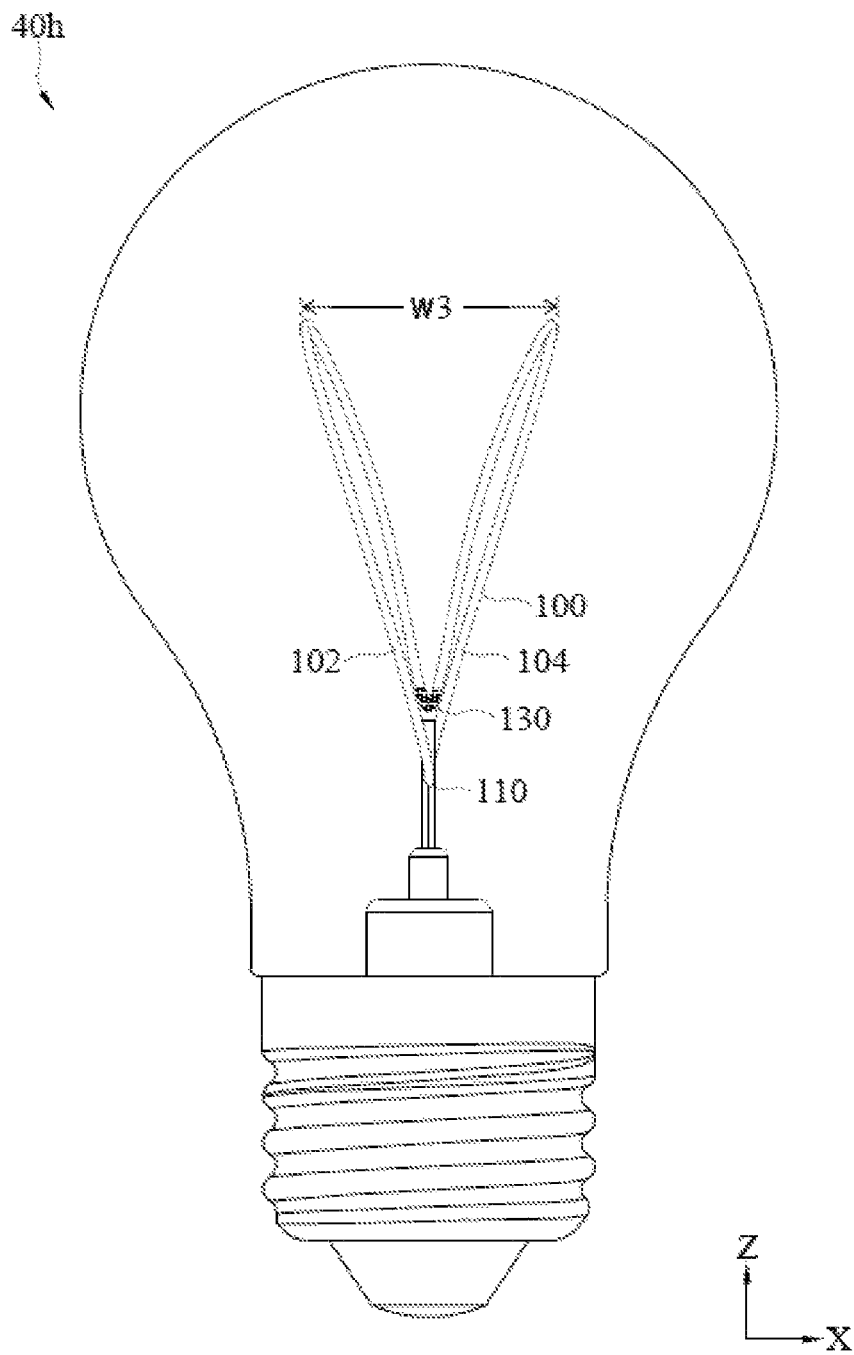
Figure 2D:
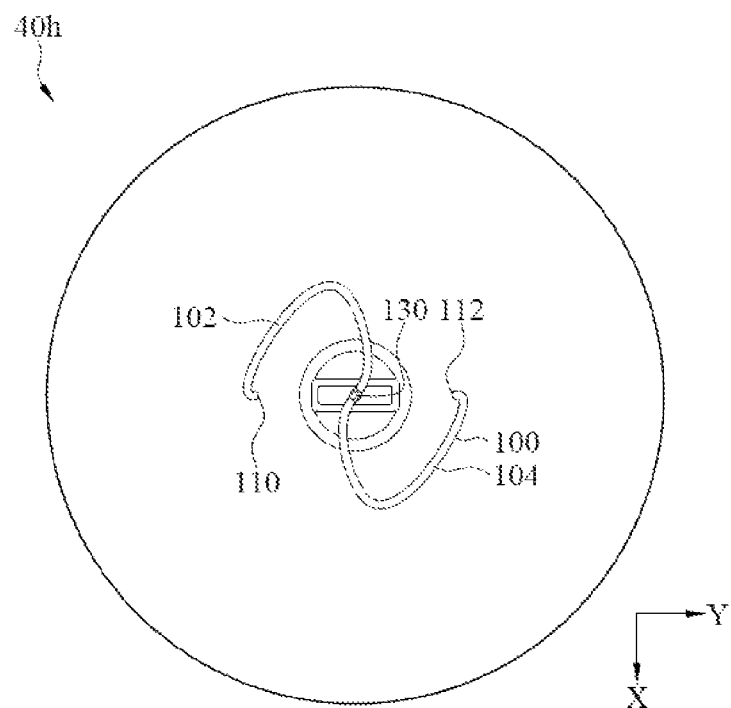

Please refer to FIGS. 2A and 2B to 2D. FIG. 2A shows a perspective view of an LED bulb 40h according to an embodiment of the present invention. FIGS. 2B to 2D show a side view, another side view, and a top view of the LED bulb 40h in FIG. 2A, respectively. In this embodiment, as shown in FIGS. 2A to 2D, the LED bulb includes a lamp housing 12, a bulb base 16 connected to the lamp housing 12, a stem 19, and a single LED filament 100 where the stem 19, and the single LED filament 100 are in the lamp housing 12. The stem 19 includes a stem bottom and a stem top (or stand 19a) opposite to the stem bottom. The stem bottom is connected to the bulb base 16, and the stem top extends into the interior of the lamp housing 12 (e.g., the stem top may be extended into approximately the center of the lamp housing 12). The LED filament 100 includes a filament body and two filament electrodes 110 and 112. The two filament electrodes 110 and 112 are located at opposite ends of the filament body. The filament body is the part of the LED filament 100 that excludes the filament electrodes 110 and 112.

During the manufacturing process of traditional bulbs, in order to avoid a tungsten wire burning in the air thereby causing the oxidative fracture failure, a glass structure with a horn shape (hereinafter refer to as "horn stem") is designed to be disposed at the opening of the glass lamp housing and then the horn stem is sintered and sealed to the glass lamp housing. Then, a vacuum pump is connected to the lamp housing through the port of the horn stem to replace the air inside the lamp housing with nitrogen so as to suppress the combustion and oxidation of the tungsten wire inside the lamp housing. Eventually, the port of the horn stem will be sintered and sealed. Therefore, the vacuum pump can be applied to replace the air inside the lamp housing with full nitrogen or to configure a moderate ratio of nitrogen and helium inside the lamp housing through the stem to improve the thermal conductivity of the gas in the lamp housing and to remove the water mist in the air at the same time. In one embodiment, the gas inside the lamp housing can also be replaced with a moderate ratio of nitrogen and oxygen or a moderate ratio of nitrogen and air. The oxygen or air content is 1% to 10%, preferably 1% to 5% of the volume of the lamp housing. When the base layer contains saturated hydrocarbons, during the use of the LED bulbs, the saturated hydrocarbons will generate free radicals under the effect of light, heat, stress, etc. The generated free radicals or activated molecules will combine with oxygen to form peroxide radicals. Thus, the lamp housing filled with oxygen may increase thermal resistance and light resistance of the base layer having saturated hydrocarbons.

During the manufacturing process of the LED bulb, in order to increase the refractive index of the lamp housing 12 to the light emitted by the LED filament, some impurities, such as rosin, may be attached to the inner wall of the lamp housing 12. The lamp housing 12 can be vacuum dried to reduce the impurity content in the inner wall of the lamp housing 12 or in the gas filled in the lamp housing 12. After the lamp housing 12 is vacuum dried, the average thickness of the impurity deposition per square centimeter of the inner wall area of the lamp housing 12 is 0.01 to 2 mm, and the thickness of the impurity is preferably 0.01 to 0.5 mm. In one embodiment, the content of the impurity per square centimeter of the inner wall area of the lamp housing 12 accounts for 1% to 30%, preferably 1% to 10% of the content of the impurity on the inner wall of the entire lamp housing 12. The content of the impurity can be adjusted, for example, by a method of vacuum drying to the lamp housing 12. In another embodiment, a part of impurities may be left in the gas of the lamp housing 12, and the content of impurities in the gas is 0.1% to 20%, preferably 0.1 to 5%, of the volume of the lamp housing 12. The impurity content may be adjusted by the method of vacuum drying to the lamp housing 12. Because a small amount of impurities is contained in the filling gas, the light emitted by the LED filament is scattered or refracted by the impurities, and thus the light emitting angle may be increased, which is beneficial to improving the light emitting effect of the LED filament. Furthermore, since the impurity content in the filling gas is low, the heat transfer effect is increased, and the heat dissipation effect of the LED light bulb is improved. Finally, by further reducing the impurity content in the base layer 240b (for example, the silicone-modified polyimide resin composition), the strength of the base layer 240b is increased, thereby effectively increasing the service life of the LED filament.

A Cartesian coordinate system having an X-axis, a Y-axis and a Z-axis is oriented for the LED light bulb, where the Z-axis is parallel to the stem 19, and the LED filament 100 has at least two first bending point and at least one second bending points when the LED filament is bent. The at least two first bending point and the at least one second bending points are arranged alternately, and the height of any one of the at least two first bending point on the Z-axis is greater than that of any one of the at least one second bending points. In one embodiment, the distances between any of two adjacent first bending points on the Y-axis or on the Z-axis are equal. Therefore, the appearance of the LED filament can be neat and beautiful. In an embodiment, the distance between the two adjacent first bending points on the Y-axis or on X-axis has a maximum value D1 and a minimum value D2, where the range of D2 is from 0.5D1 to 0.9D1, and the light flux distribution on each plane is relatively consistent. Let (1) the diameter of the bulb base 16 be W1 (shown in FIG. 2B), (2) the maximum diameter of the lamp housing 12 or the maximum horizontal distance between the lamp housings 12 in the Y-Z plane be W2 (shown in FIG. 2B), and (3) the maximum width of the LED filament 100 in the Y-axis direction on the Y-Z plane (shown in FIG. 2B) or the maximum width in the X-axis direction on the X-Z plane be W3 (shown in FIG. 2C). Specifically, FIGS. 2B and 2C are merely illustrative, and the magnitude of W1, W2, and W3 is such that W3 is between W1 and W2, that is, W1<W3<W2, and is not a visual magnitude as shown in FIGS. 2B and 2C. When the LED filament is bent, the distance between adjacent first bending points and/or adjacent second bending points in the Z-axis direction is wide, which is beneficial to improving the heat dissipation effect of the LED filament. In the manufacturing process of the LED bulb, the LED filament 100 can be folded into the inner space of the lamp housing 12 first, and then the filament 100 can be manually or mechanically extended in the lamp housing 12 so that the maximum length of the filament 100 on the X-Z plane satisfies the above-mentioned relationship.

As shown in FIG. 2A to FIG. 2D, in this embodiment, the LED filament 100 has one conductor section 130 and two LED sections 102 and 104. The two adjacent LED sections 102 and 104 are connected through the conductor section 130. The bent portion of the LED filament 100 at the highest point has an arc shape. That is, the LED sections 102 and 104 show arc shapes respectively at the highest point of the LED filament 100. The conductor section 130 shows an arc shape at the lower point of the LED filament as well. The LED filament 100 may be configured to have a structure where each bent conductor section 130 is followed by one segment, and each LED sections 102, 104 is formed into a respective section.

Moreover, since a flexible substrate (preferably made of a silicone-modified polyimide resin composition) is adopted by the LED filament 100, the LED sections 102 and 104 also have a certain degree of bending ability. In this embodiment, the two LED sections 102 are respectively bent to form an inverted U shape, and the conductor section 130 is located between the two LED sections 102, and the degree of bending of the conductor section 130 is the same as or greater than that of the LED section 102. That is, the two LED sections 102 are respectively bent at the higher point of the LED filament 100 to form an inverted U shape and have a bent radius R1. The conductor section 130 is bent at the lower point of the LED filament 100 and has a bent radius R2, where R1 is greater than R2. The arrangement of the conductor sections 130 enables the LED filament 100 to achieve a bending with a small turning radius in a limited space. In one embodiment, the bending points of the LED section 102 and that of the LED section 104 are at the same height in the Z direction. In addition, the height of the pole 19a corresponds to the height of the conductor section 130. For example, the lowest portion of the conductor section 130 may be connected to the top of the pole 19a, so that the overall shape of the LED filament 100 may not be easily deformed. In different embodiments, the conductor sections 130 may be connected to the pole 19a by passing through a hole on the top of the pole 19a, or the conductor sections 130 may be connected to the pole 19a by being glued on the top of the pole 19a, but is not limited thereto. In one embodiment, the conductor section 130 and the pole 19a may be connected by a conductive wire. For example, a conductive wire is extended from the top of the pole 19a and connected to the conductor section 130.

As shown in FIG. 2B, in this embodiment, in the Z direction, the height of the conductor section 130 is higher than that of the two electrodes 110 and 112. The two LED sections 102 may be seen as the two electrodes 110 and 112 extending upward to the highest point respectively and then bending down and further extending to connect to the conductor section 130. As shown in FIG. 2C, in this embodiment, the outline of the LED filament 100 in the X-Z plane is similar to a V shape, that is, the two LED sections 102 are extended obliquely upward and outward respectively, and are bent at the highest point then extended downwardly and inwardly to the conductor section 130. As shown in FIG. 2D, in this embodiment, the outline of the LED filament 100 in the X-Y plane has an S shape. As shown in FIG. 2B and FIG. 2D, in this embodiment, the conductor section 130 is located between the electrodes 110 and 112. As shown in FIG. 2D, in this embodiment, in the X-Y plane, the bending point of the LED section 102, the bending point of the LED section 104, and the electrodes 110, 112 are located substantially on a circumference of a circle taking the conductor section 130 as a center.

Figure 3:
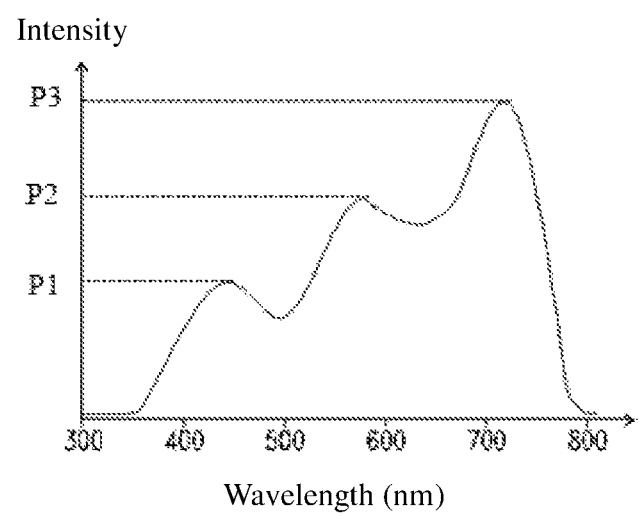
FIG. 3 illustrates a schematic emission spectrum of an LED filament according to an embodiment of the present invention.
Figure 4:
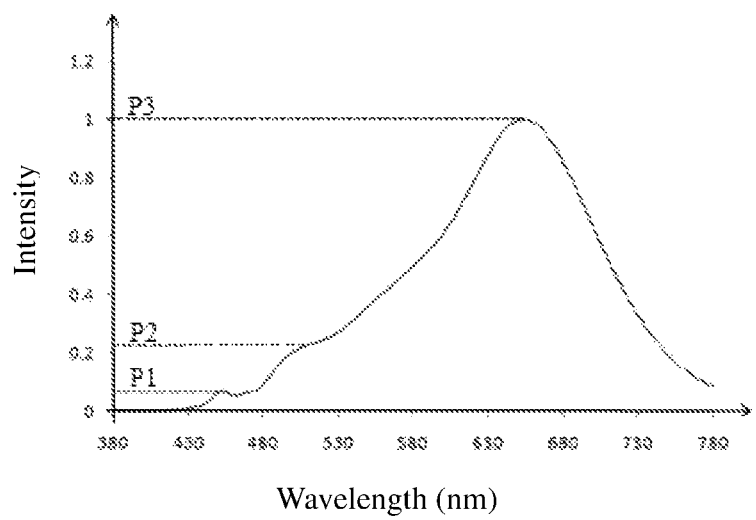
FIG. 4 illustrates a schematic emission spectrum of an LED filament according to an embodiment of the present invention.

Please refer to FIG. 3, which is a schematic emission spectrum of an LED light bulb according to an embodiment of the present invention. In this embodiment, the LED bulb lamp may be any LED bulb lamp disclosed in the previous embodiments, and a single LED filament (which may be any LED filament disclosed in the previous embodiments) is provided in the LED light bulb. By measuring the light emitted by the LED light bulb with a spectrometer, a spectrum diagram as shown in FIG. 3 may be obtained. From the spectrum diagram, it can be seen that, the spectrum of the LED bulb lamp is mainly distributed between the wavelengths from 400 nm to 800 nm, and three peaks P1, P2, P3 appear at three places in this range. The peak P1 is about between 430 nm and 480 nm, the peak P2 is about between 580 nm and 620 nm, and the peak P3 is about between 680 nm and 750 nm. With regard to intensity, the intensity of the peak P1 is smaller than the intensity of the peak P2, and the intensity of the peak P2 is smaller than the intensity of the peak P3. As shown in FIG. 3, such a spectral distribution is close to the spectral distribution of a traditional incandescent filament lamp, and is also close to the spectral distribution of natural light. In an embodiment, a schematic emission spectrum of a single LED filament is shown in FIG. 4. It can be seen from this spectrum that, the spectrum of the LED bulb lamp is mainly distributed between the wavelength from 400 nm to 800 nm. There are three peaks P1, P2, and P3 appear in this range. The peak P1 is between about 430 nm and 480 nm, the peak P2 is between about 480 nm and 530 nm, and the peak P3 is between about 630 nm and 680 nm. Such a spectral distribution is close to the spectral distribution of a traditional incandescent filament lamp, and is also close to the spectral distribution of natural light.

Figure 5:
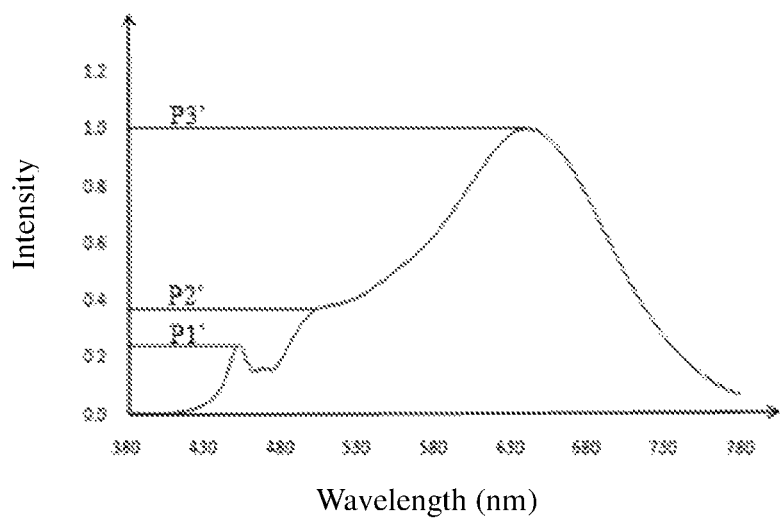
FIG. 5 illustrates a schematic emission spectrum of an LED filament according to an embodiment of the present invention.

Please refer to FIG. 5. FIG. 5 is a light emission spectrum of an LED light bulb according to an embodiment of the present invention. As can be seen from the figure, the spectrum distribution of the LED bulb lamp between the wavelength of 400 nm to 800 nm has three peaks P1', P2', and P3' similar to that shown in FIG. 4. The difference is that the intensity of P1' is greater than that of P1, and the full width at half maximum of P3' is greater than that of P3. The LED bulb has an average color rendering index Ra (R1-R8) greater than 95 and a saturated red (R9) greater than or equal to 90. The light efficiency (Eff) of the LED filament is greater than or equal to 100 lm/w.

The term "a filament" referred to in the present invention may be the aforementioned conductor section and the LED sections connected to each other, or may be formed by LED sections only. The LED sections may have the same and continuous light conversion layer (including the same and continuous top layer or bottom layer), and two conductive electrodes electrically connected to the conductive bracket of the light bulb are only provided at both ends. The structure that complies with the above description is the single LED filament structure mentioned in the present invention.

The invention has been described above in terms of the embodiments, and it should be understood by those skilled in the art that the present invention is not intended to limit the scope of the invention. It should be noted that variations and permutations (especially the embodiments that the LED filament provided in FIG. 1 combined to the LED light bulb provided in FIG. 2) equivalent to those of the embodiments are intended to be within the scope of the present invention. Therefore, the scope of the invention is defined by the scope of the appended claims.

What is claimed is:

1. An LED light bulb, comprising:
a lamp housing, filled with gas including nitrogen and oxygen, where the oxygen content is 1% to 5% of a volume of the lamp housing;
a bulb base connected to the lamp housing;
a stem connected to the bulb base and located in the lamp housing; and
a single LED filament, disposed in the lamp housing and the LED filament comprising:
a conductive section, comprising a conductor;
at least two LED sections connected to each other by the conductive section, and each of the LED sections comprises at least two LED chips electrically connected to each other through a wire;
two electrodes, electrically connected to the LED section; and
a light conversion layer with a top layer and a base layer, covering the at least two LED sections, the conductive section and the two electrodes, and a part of each of the two electrodes is exposed respectively; wherein the base layer of the light conversion layer is a silicone-modified polyimide resin composition composite film;

a Cartesian coordinate system having an X-axis, a Y-axis and a Z-axis is oriented for the LED light bulb, where the Z-axis is parallel to the stem, wherein W1 is a diameter of the bulb base, W2 is a maximum diameter of the lamp housing or a maximum horizontal dimension of the lamp housing in the Y-Z plane, and W3 is a maximum width of the LED filament in the Y-axis direction on the Y-Z plane or the maximum width in the X-axis direction on the X-Z plane, where W1<W3<W2.

2. The LED light bulb according to claim 1, wherein the LED filament has at least two first bending points and at least one second bending point when the LED filament is bent.

3. The LED light bulb according to claim 2, wherein the at least two first bending points and the at least one second bending point are arranged alternately.

4. The LED light bulb according to claim 2, wherein a height of any one of the at least two first bending points on the Z-axis is greater than a height of any one of the at least one second bending point.

5. The LED light bulb according to claim 2, wherein the LED filament has a plurality of the first bending points, distances between any of two adjacent first bending points of the first bending points on the Y-axis are equal or distances between any of two adjacent first bending points of the first bending points on the Z-axis are equal.

6. The LED light bulb according to claim 2, wherein the LED filament has a plurality of the first bending points, a distance between two adjacent first bending points of the first bending points on the Y-axis has a maximum value D1 and a minimum value D2, or a distance between two adjacent first bending points of the first bending points on the X-axis has the maximum value D1 and the minimum value D2, wherein a range of D2 is from 0.5*D1 to 0.9*D1.

7. The LED light bulb according to claim 1, wherein the LED filament includes one conductor section and two LED sections, where a bending point of each of the two LED sections and each of the two electrodes are located substantially on a circumference of a circle taking the conductor section as a center.

8. The LED light bulb according to claim 7, wherein the LED filament comprises a plurality of the LED sections, and each of the LED sections comprises a plurality of the LED chips, a shortest distance between two LED chips of the LED chips located respectively in two adjacent LED sections is greater than a distance between two adjacent LED chips of the LED chips in the same LED section.

9. The LED light bulb according to claim 8, wherein a length of the wire is shorter than a length of the conductor.

10. The LED light bulb according to claim 1, wherein an impurity is attached to the inner wall of the lamp housing, where an average thickness of the impurity deposited per square centimeter of an inner wall area of the lamp housing is 0.01 to 2 mm.

11. The LED light bulb according to claim 10, wherein a spectral distribution of the light bulb is between a wavelength range of about 400 nm to 800 nm, and three peak wavelengths P1, P2, and P3 appear in wavelength ranges corresponding to light emitted by the light bulb, wherein a wavelength of the peak P1 is between 430 nm and 480 nm, a wavelength of the peak P2 is between 580 nm and 620 nm, and a wavelength of the peak P3 is between 680 nm and 750 nm, wherein a light intensity of the peak P1 is less than a light intensity of the peak P2, and the light intensity of the peak P2 is less than a light intensity of the peak P3.

\* \* \* \* \*